(12) United States Patent
Voldman

(10) Patent No.: US 6,380,570 B1
(45) Date of Patent: Apr. 30, 2002

(54) GATE OVERVOLTAGE CONTROL NETWORKS

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/556,211

(22) Filed: Apr. 21, 2000

(51) Int. Cl.$^7$ ................................................ H01L 29/72
(52) U.S. Cl. .................... 257/288; 257/355; 257/367; 257/488; 326/80; 326/93
(58) Field of Search .................. 251/288, 367, 251/488, 355; 326/80, 93

(56) References Cited

U.S. PATENT DOCUMENTS

| | | |
|---|---|---|
| 4,864,454 A | 9/1989 | Wolfe |
| 4,989,057 A | 1/1991 | Lu |
| 5,401,996 A | 3/1995 | Kelly |
| 5,449,940 A | 9/1995 | Hirata |
| 5,477,413 A | 12/1995 | Watt |
| 5,519,242 A | 5/1996 | Avery |
| 5,563,525 A | 10/1996 | Lee |
| 5,596,217 A * | 1/1997 | Yamaoka ..................... 257/288 |
| 5,707,886 A | 1/1998 | Consignlio et al. |
| 5,767,550 A | 6/1998 | Calafut et al. |
| 5,793,588 A | 8/1998 | Jeong |
| 5,811,857 A | 9/1998 | Assaderaghi et al. |
| 5,815,360 A | 9/1998 | Consiglio et al. |
| 5,818,088 A | 10/1998 | Ellis |
| 5,838,033 A * | 11/1998 | Smooha ...................... 257/288 |
| 5,952,695 A | 9/1999 | Ellis-Monaghan et al. |

* cited by examiner

Primary Examiner—Edward Wojciechowicz
(74) Attorney, Agent, or Firm—Scully, Scott, Murphy & Presser; Richard A. Henkler

(57) ABSTRACT

A semiconductor device which comprises an anode of a first conductivity type; a cathode of a second conductivity type; a device region separating said anode and said cathode, said device region comprises at least a gate dielectric; and an overvoltage control network coupled to the gate dielectric of said device region, wherein said overvoltage control network substantially reduces electrical overstress of said gated device.

30 Claims, 17 Drawing Sheets

GATE OVERVOLTAGE CONTROL NETWORKS

DESCRIPTION

1. Field of the Invention

The present invention relates to semiconductor structures and, more particular to gate overvoltage control networks that can be used in semiconductor structures to protect the various gated devices present therein from exhibiting overvoltage conditions which may lead to early electrostatic discharge (ESD) failures. In some cases, the gate overvoltage control network of the present invention may be used to protect gated devices from undergoing charged device model (CDM) ESD failures.

2. Background of the Invention

In semiconductor processing, SOI (silicon-on-insulator) technology is becoming increasingly important since it permits the formation of high-speed integrated circuits. In SOI technology, a relatively thin layer of semiconducting material, e.g., Si, overlays a layer of insulating material (buried oxide region). This relatively thin layer of semiconducting material is generally the area wherein active devices are formed in SOI devices. Devices formed on SOI offer many advantages over their bulk Si counterparts, including higher performance, absence of latch-up, higher packing density and low voltage applications.

Despite the advantages obtained using SOI technology, SOI circuits, like other electronic devices, are susceptible to electrostatic discharge (ESD), i.e., a surge in voltage (negative or positive) that occurs when large amount of current is applied in the circuit. Moreover, the handling of SOI devices themselves may lead to charging of the substrate.

To discharge electrostatic impulses, ESD protection schemes need a low voltage turn-on and a high current drive (the ability to generate or sink a large amount of current before a large amount of negative or positive voltage is developed). Traditional bulk overvoltage protection schemes, such as diodes, do not work well on SOI because of the presence of the relatively thin SOI buried oxide layer. That is, conventional diodes on SOI devices have small current drivability because the current is carried laterally (limited by the thickness of the semiconductor material).

One approach for protecting SOI circuitry from ESD is found in U.S. Pat. No. 4,989,057 to Lu. Lu discloses a gated diode, which could be used for ESD design. The gated diode disclosed in Lu consists of a floating-body SOI transistor, with the gate connected to a signal pad. Although the diode disclosed in Lu can provide some ESD protection, the disclosed diode does not allow for obtaining ideal diode characteristics. Some reasons preventing ideal diode characteristics with the diodes disclosed in Lu include: (1) alignment tolerance of the substrate causes large process-induced variations; and (2) the conventional diode structure may be a polysilicon diode, which receives extensions and halo implants (implants normally utilized in deep submicron MOSFETs) that degrade the ideal characteristics on SOI. Other ESD protection schemes for the front side of the SOI wafer are also known. Common to each is that the energy developed across prior art ESD protection schemes can be substantial. Thus, the heat generated by such ESD protection schemes must be dissipated by the relatively thin semiconducting layer. In cases wherein the heat becomes too excessive, destruction of the SOI circuit may occur.

Another problem with prior art ESD networks is that under some operating conditions the various gated devices in which the ESD networks are suppose to protect undergo overvoltage conditions which may lead to early ESD failures. This problem is not limited to SOI devices. Instead, it exists in bulk Si devices as well.

Another problem with prior art ESD protection schemes is that they do not adequately eliminate charged device model (CDM) failure mechanism. In receiver circuits in SOI technology, experimental work has shown that N-channel metal oxide semiconductor field effect transistors (MOSFETs) fail due to current flowing in from the $V_{dd}$ power supply through the gate of the MOSFET causing MOSFET failure.

To date, no adequate control network has been developed that can be used in semiconductor structures to prevent the various gated devices present therein from exhibiting the above mentioned problems. There is thus a great need for developing a control network that can substantially eliminate overvoltage and/or avoid CDM ESD failures in the various gated devices present in semiconductor structures.

SUMMARY OF THE INVENTION

In one aspect, the present invention provides an overvoltage control network that can be implemented in various semiconductor structures, including SOI devices and bulk Si devices, that contain at least one gated device therein.

In yet another aspect, the present invention provides an overvoltage control network that is capable of reducing overvoltage, electrical stress, tunneling current, ESD, and CDM failure mechanism in various semiconductor structures which include at least one gated device region therein.

In another aspect, the present invention provides an overvoltage control network that can be used with diodes such as polysilicon diodes; buried resistors; resistors; transistors such as MOSFET, PFETs and NFETs; or other gated devices in which an overvoltage condition may cause device failure.

These and other advantages are achieved in the present invention by providing an overvoltage control network that is coupled to the gate of a gated device region that is present in a semiconductor structure.

Specifically, the present invention provides a semiconductor structure which comprises: an anode of a first conductivity type; a cathode of a second conductivity type; a device region separating said anode and said cathode, said device region including at least a dielectric gate; and an overvoltage control network coupled to the dielectric gate of said device region, wherein said overvoltage control network substantially reduces electrical overstress of said dielectric gate in said device region.

The term "device region" is used herein to denote a gated device region in which a dielectric layer separates a gate conductor from active areas that are present in a semiconductor substrate (bulk Si, Ge, III/V semiconductor compounds such as InAs, SiGe, GaAs and SiGe, silicon-on-insulators (SOIs), layered semiconductors such as Si/SiGe). Examples of suitable gated devices that can be employed in the present invention include, but are not limited to: diodes, resistors, buried resistors, MOSFETs, NFETs, PFETs and other like gated devices.

The term "anode" is used herein to denote an electron-collecting region, i.e., electron deficient region, of a semiconductor structure. Examples of anode regions include, but are not limited to: drain regions, positive terminals of a power supply and output terminals of an integrated circuit.

The term "cathode" is used herein to denote an electron-donating region, i.e., electron rich region, of a semiconductor structure. Examples of cathode regions include, but are not limited to: source regions, negative terminals of a power supply, pad regions and input terminals of an integrated circuits.

The term "overvoltage control network" is used herein to denote any network that is capable of reducing electrical overstress that may exist in a gated device region of a semiconductor structure. The overvoltage control network used in the present invention must be capable of being directly coupled to a gate dielectric layer present in the gated device region. Examples of suitable overvoltage control networks that can be employed in the present invention include, but are not limited to: diodes, resistors, buried resistors, dividers, on-MOSFETs, MOSFET voltage dividers, dummy inverters, lubistors, and other like control networks that can reduce electrical overstress of said gated device region. Combinations of one or more of these overvoltage control networks are also contemplated in the present invention.

The overvoltage control network may be connected to various external power supplies as well as the anode and cathode mentioned above. The overvoltage control network can also be used in conjunction with other ESD protection networks that are well known to those skilled in the art.

In one highly preferred embodiment of the present invention, the structure comprises a buried resistor that is formed in a bulk semiconducting substrate or a SOI substrate, said buried resistor having a dielectric gate and being located between an anode and a cathode, and an overvoltage control network coupled to the dielectric gate of said buried resistor, said overvoltage control network being coupled to two different power supplies.

In this embodiment of the present invention, the overvoltage control network may comprise a MOSFET voltage divider wherein the MOSFETs are in an "on" state. In a bulk implementation, using PFETs, the wells of the network are either floating well elements to avoid clamping to the ground or $V_{dd}$ power supplies. Alternatively, the network can comprise well-bias control elements to avoid clamping of the buried resistors. The overvoltage control networks are established to avoid d.c. current paths between $V_{dd}$ and $V_{ss}$ power supplies.

The buried resistor structure may also use a non-voltage divider network as the overvoltage control network. When a non-voltage network is used, it typically consists of a network that sets the potential for standard functional states and lets the network float in unpowered states. For example, an NFET can be used below a voltage divider network whose gate is connected to $V_{dd}$. When the chip is pulsed negatively, the $V_{dd}$ is unpowered and the NFET is off. This allows the overvoltage control network to float and avoid overvoltage.

Another means of setting the gate potential of the buried resistor is to connect the buried resistor gate through a resistor prior to the power supply voltage. This would permit the gate to couple to the input pad for positive or negative voltages. If the resistor element is of the order of 1 kOhm, then the pad voltage will allow the gate of the resistor to follow the pad potential and decouple from the $V_{dd}$ power supply. Another means of power supply decoupling in the buried resistor embodiment of the present invention is to use a dummy inverter as the overvoltage control network to set the potential of the gate of the buried resistor. The inverter can also be followed by a resistor so that there is no current path back to a power supply at fast time scales. For example, the input of the inverter can be connected to ground via a resistor providing a "low". This is then inverted to a "high" to the gate of the buried resistor. A resistor can exist between the buried resistor gate and the inverter. For ESD pulses, the gate will float with positive and negative pulses and will not be connected directly to a pad node.

In another highly preferred embodiment of the present invention, the gated device is a polysilicon gated diode that is formed on a bulk semiconductor substrate or on an SOI substrate. In such a gated device, the gated diode is typically connected between the pad and the $V_{cc}$ power supply. A first network to solve overstress in such a gated device includes a first and second NFET in series, wherein the first NFET is connected between the $V_{cc}$ and the second NFET. The gate of the first NFET is such that the first NFET is "on", i.e., gate tied to $V_{cc}$. The second NFET has its gate connected to pad, the source and body connected together which in turn is connected to the polysilicon gate of the gated diode device.

When the pad is low, the second NFET is "off", allowing the gate of the polysilicon diode device to float. This prevents the electrical overstress from occurring between the pad and the gate of the polysilicon diode. When the gate is "high", the NFET is "on", and the gate follows the power supply voltage to $V_{cc}$.

For a gated diode connected between the pad and the ground connection, a similar control network can be used. In this case, a first and second PFET are employed. The first PFET acts to reduce the voltage stress across the second PFET in series. The first PFET is connected between the second PFET and the ground. The gate of the first PFET is "on" acting as a pass transistor voltage reducing element. The second PFET is connected with the gate connected to the pad node; the well and source are connected together and then these nodes are also connected to the polysilicon gate of the diode element. When the pad is "high", the second PFET is "off" allowing the gate node of the polysilicon diode to float with the input node. When the pad is "low", the PFET is "on", and the anode, cathode and the gate of the polysilicon diode have no voltage stress.

In the above embodiment concerning a polysilicon gated diode, the first transistor element (NFET or PFET) can be replaced with a buried resistor, a resistor or a plurality of other elements that act as a voltage reduction means as well as serving the role as sourcing the current to the polysilicon gated diode controller elements.

In another highly preferred embodiment of the present invention, the gated device is a N-channel MOSFET pass transistor. In such systems, CDM events cause ESD failures due to current flowing in from the $V_{dd}$ power supply through the gate causing MOSFET failure. In one embodiment, the overvoltage control network is a resistor which prevents current flowing from the $V_{dd}$ due to a CDM event. The presence of the resistor in such a structure also prevents tunneling gate current from charging the body of the pass transistor for thin and ultra-thin dielectrics.

In the N-channel MOSFET pass device, the overvoltage control network may also be a buried resistor, with the gate thereof connected to $V_{dd}$ to prevent electrical overstress. Other possible overvoltage control networks that can be used in this embodiment of the present invention include: dummy inverters and dummy inverters and a SOI MOSFET connected in a resistor configuration.

The foregoing and other advantages and features of the present invention will be apparent from the following more particularly preferred embodiments of the present invention, as illustrated in the drawings and described hereinbelow.

DETAILED DESCRIPTION OF THE INVENTION

Figure 1:
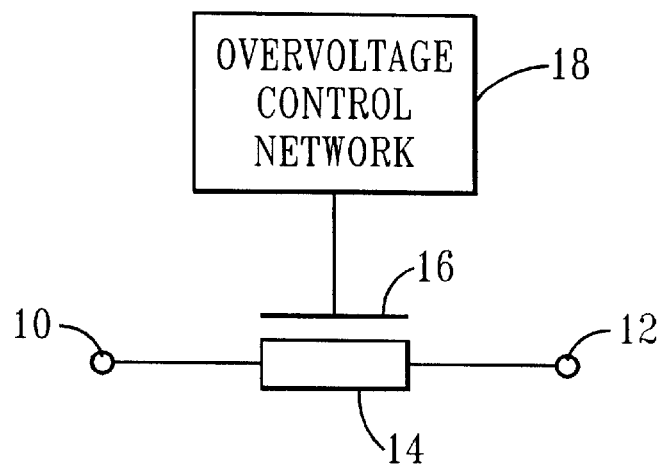
FIG. 1 is a generic block diagram of a semiconductor structure of the present invention. The structure includes an anode 10, a cathode 12, a gated device 14 and an overvoltage control network 18 connected to gate 16 of gated device 14.

The present invention which provides semiconductor structures in which the overstressing of a gated device is substantially eliminated by coupling an overvoltage control network to the gate of the gated device will now be described in more detail by referring to the drawings accompanying the present application. It should be noted that in the drawings like reference numerals are used for describing like and/or corresponding elements.

FIG. 1 illustrates a semiconductor structure of the present invention which comprises an anode of a first conductivity type 10; a cathode of a second conductivity type 12; a gated device 14 separating said anode and said cathode, said gated device including at least a gate dielectric 16 overlaying said anode and cathode; and an overvoltage control network 18 coupled to the gate dielectric of said gated structure, wherein said overvoltage control network substantially reduces electrical overstress of said gated device.

It is noted that the various structures of the present invention including the overvoltage control networks are formed utilizing conventional processing steps and components that are well known to those skilled in the art. Since such processing steps and components are well known in the art, a detailed description of the same is not provided herein. Focus of the present invention is not on the fabrication of the device, rather it is in the specific layout of the structure.

Figure 2:
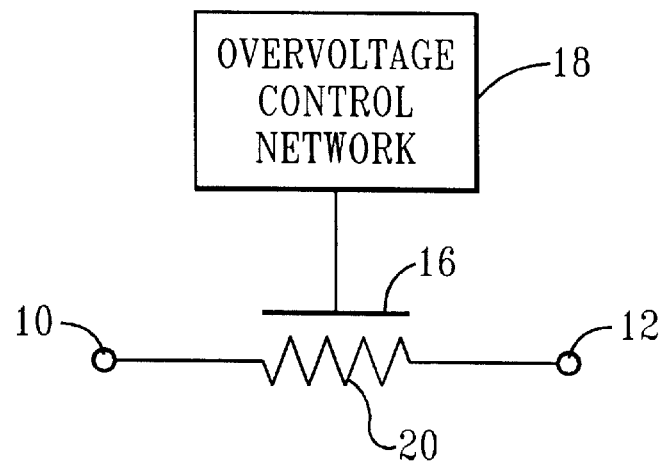
FIG. 2 is a block diagram of a buried resistor device of the present invention which includes a generic overvoltage control network of the present invention therein.

FIG. 2 shows one preferred embodiment of the present invention in which the gated device is a buried resistor element 20 that is formed in the surface of a semiconductor substrate including bulk Si or SOI substrates. As shown in FIG. 2, the buried resistor is a gated resistor in which gate 16 is coupled to overvoltage control network 18. The buried resistor is also coupled to input region 12 (e.g., cathode of the structure) and output region 10 (e.g., anode region of the structure).

Figure 3:
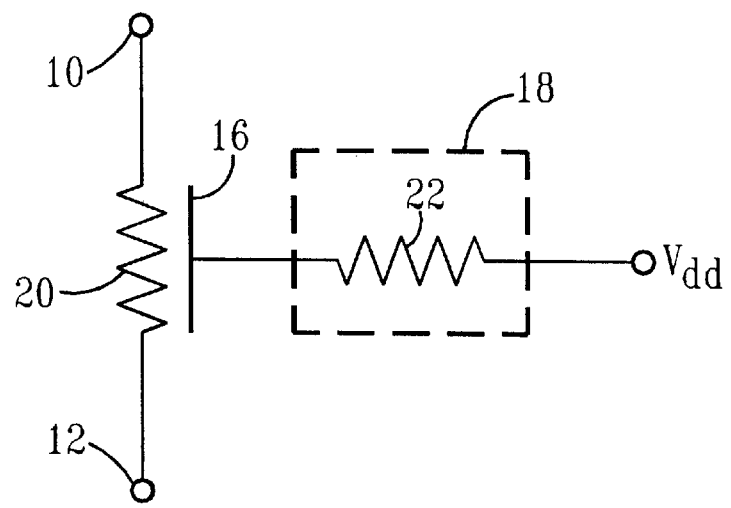
FIGS. 3–15 are circuit schematics of various buried resistor devices of the present invention in which specific overvoltage control networks are shown.

FIGS. 3–16 are circuit schematics of the buried resistor device shown in FIG. 2 in which specific overvoltage control networks are shown. Specifically, in FIG. 3, the overvoltage control network comprises a resistor 22 in which one end thereof is connected to gate 16 of buried resistor 20 and the other end of resistor 22 is coupled to a $V_{dd}$ power supply.

Figure 4:
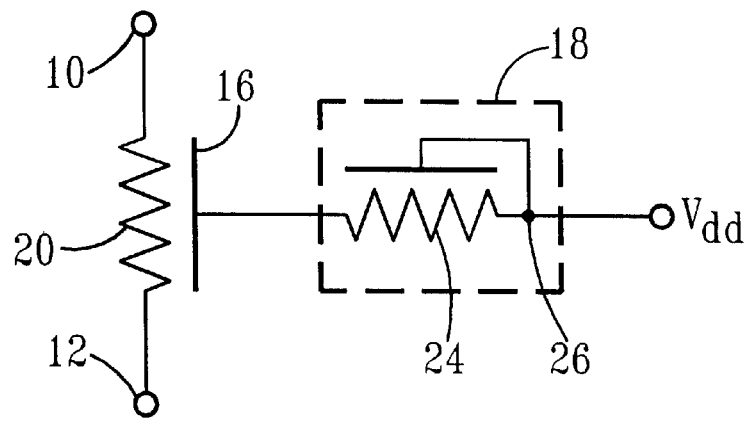

FIG. 4 shows another gated buried resistor structure in which the overvoltage control network is a gated buried resistor 24. As shown, one end of the overvoltage control network is connected to gate 16 of buried resistor 20, while the other end of the control network including the gate region is connected to a $V_{dd}$ power supply through node 26.

Figure 5:
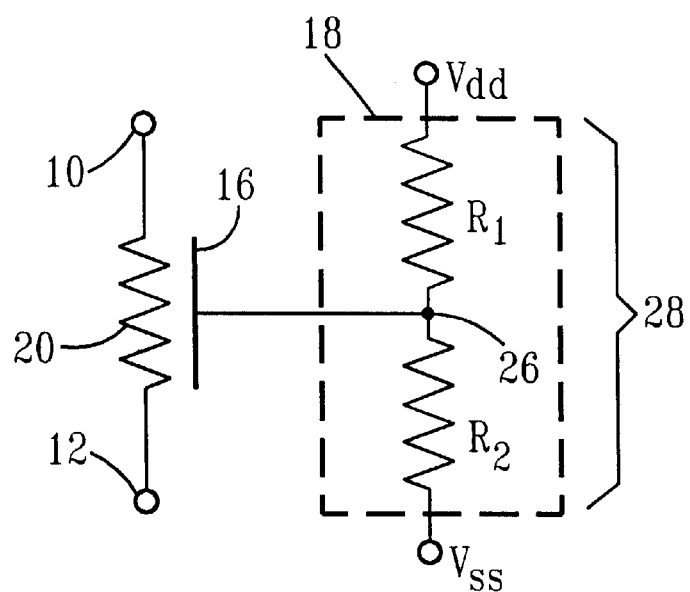

FIG. 5 shows another buried resistor embodiment wherein the overvoltage control network comprises a divider 28 which consists of two resistors, $R_1$ and $R_2$, that are connected in series with each other. As shown, ends of the resistors of the divider are connected to their own power supply. For example, $R_1$ is connected to $V_{dd}$ and $R_2$ is connected to $V_{ss}$. The divider is coupled to the gate of the buried resistor through node 26.

Figure 6:
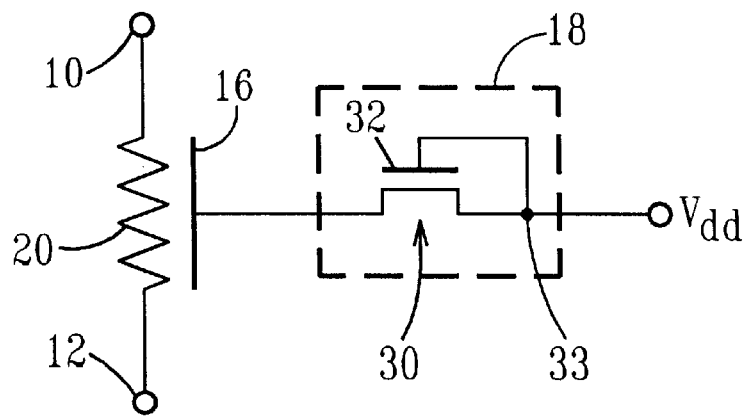

In FIG. 6, the overvoltage control network comprises an "on" MOSFET 30 which includes a gate 32. As is shown in the figure, one of the ends of the on MOSFET is tied to gate 16 of buried resistor 20 and the other is connected to a power supply $V_{dd}$ through gate node 33.

Figure 7:
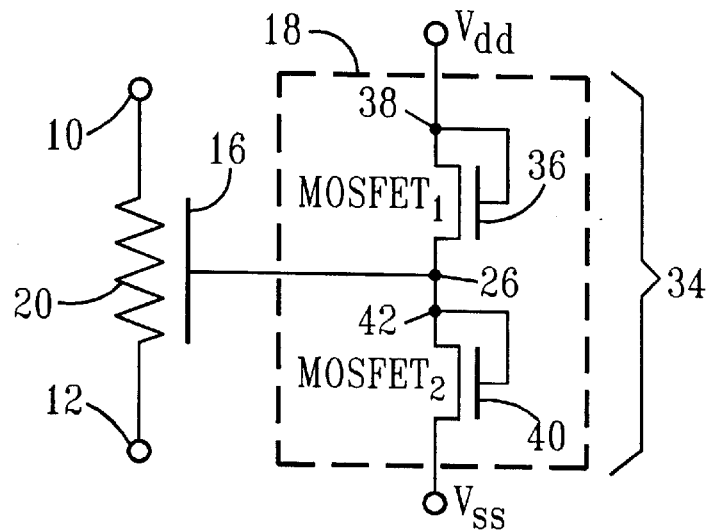

FIG. 7 shows a buried resistor device in which the control network is a MOSFET voltage divider 34. As shown, the MOSFET voltage divider comprises two MOSFETs, MOSFET$_1$ and MOSFET$_2$, which are connected in series with each other through node 26. MOSFET$_1$ includes gate 36 and gate node 38 which is the point of coupling with power supply $V_{dd}$. The other MOSFET, MOSFET$_2$, comprises gate 40 and gate node 42. A $V_{ss}$ power supply is shown coupled to MOSFET$_2$.

Figure 8:
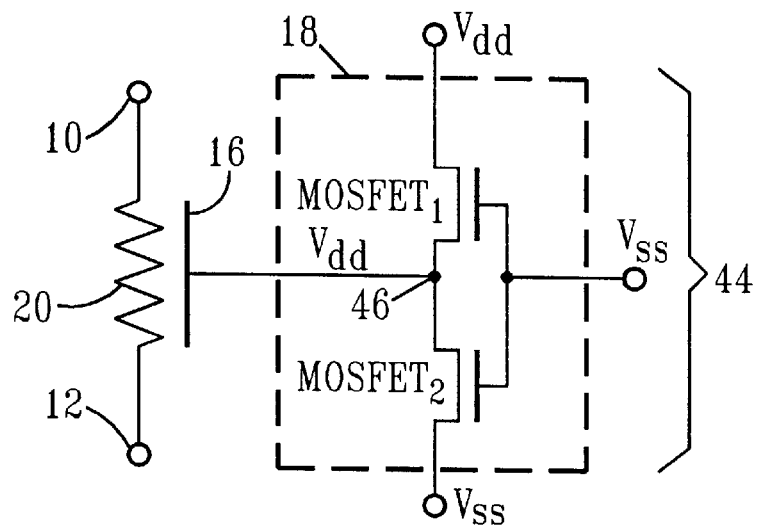

In FIG. 8, the control network comprises a dummy inverter bias network 44 which consists of two MOSFETs, denoted as MOSFET$_1$ and MOSFET$_2$, each MOSFET having a gate and being connected to each other through node 46. Node 46 is also the point of coupling to a $V_{ss}$ power supply. As shown in FIG. 8, each MOSFET is connected to its own power supply ($V_{dd}$ and $V_{ss}$). In the circuit, the portion between node 46 and gate 16 of the buried resistor 20 functions as a $V_{dd}$ power supply.

Figure 9:
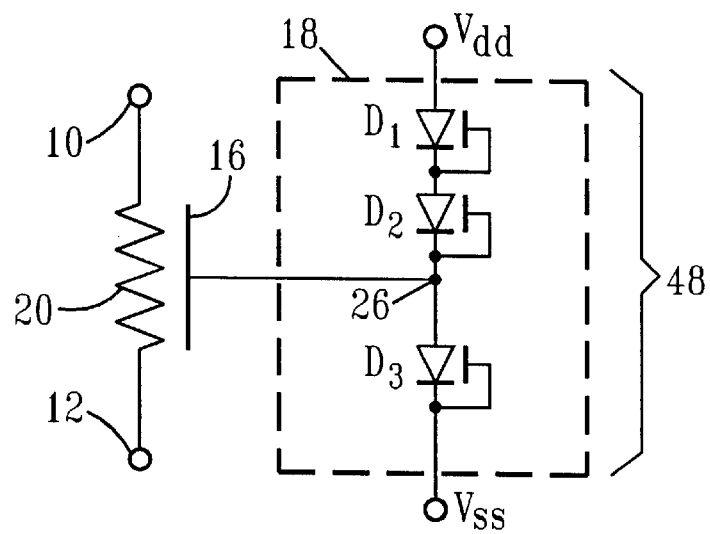

The overvoltage control network shown in FIG. 9 comprises a gated diode reference network 48 in which one end thereof is connected to $V_{dd}$ and the other end thereof is connected to $V_{ss}$. The gated diode reference network shown comprises three gated polysilicon diodes, $D_1$, $D_2$ and $D_3$, that are connected in series with each. The coupling of the gated diodes to the gated buried resistor is through node 26.

Figure 10:
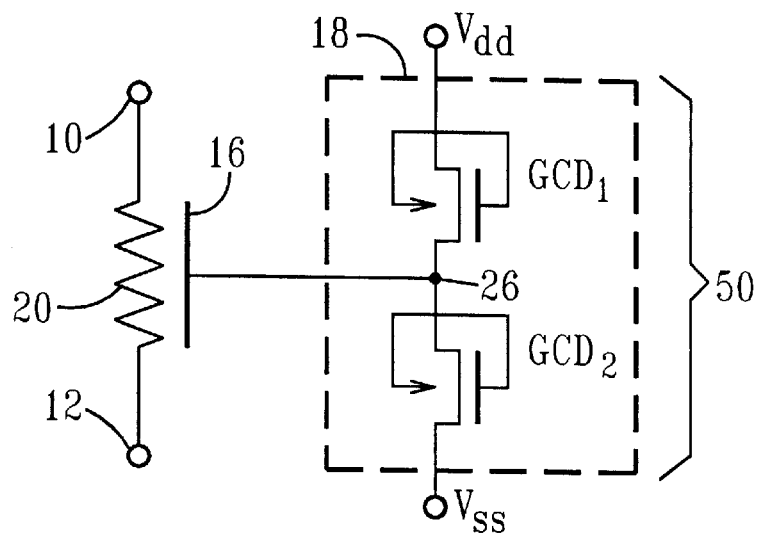

In FIG. 10, the overvoltage control network comprises a body and gate coupled SOI diode reference network 50 which comprises two body and gate coupled diodes, GCD$_1$ and GCD$_2$, coupled to each other through node 26. Node 26 is also the point at which coupling is made to gate 16 of buried resistor 20. As shown, GCD$_1$ is connected to $V_{dd}$ and GCD$_2$ is connected to $V_{ss}$.

Figure 11:
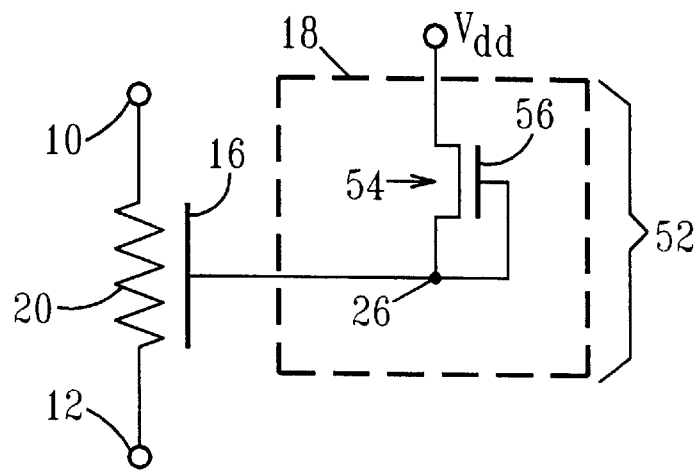

In FIG. 11, the overvoltage control network comprises diode configured MOSFET reference network 52. Specifically, the diode configured MOSFET reference comprises a PFET 54 in which gate 56 is tied to the drain of the FET through node 26. Node 26 is also the point of connection to gate 16 of buried resistor 20.

Figure 12:
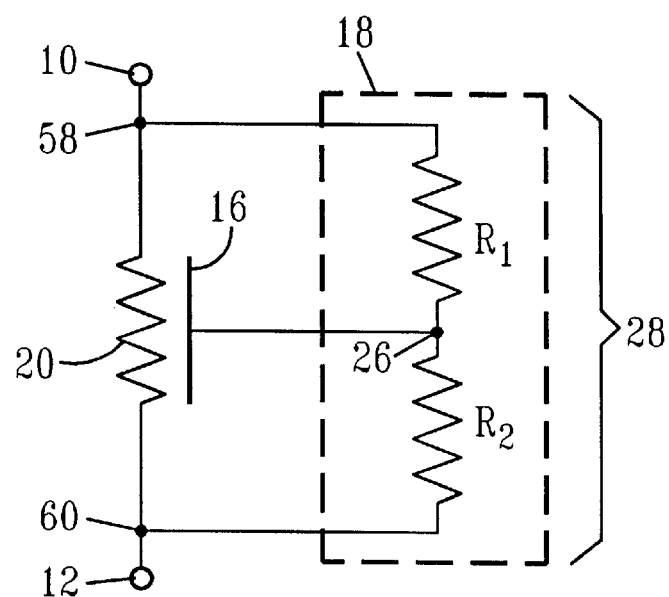

FIG. 12 illustrates another gated buried resistor structure in which the overvoltage control network is a divider 28 that consists of two resistors $R_1$ and $R_2$ that are coupled in series through node 26. In this circuit diagram, resistor $R_1$ is connected to input 10 at node 58 and resistor $R_2$ is connected to output 12 at node 60.

Figure 13:
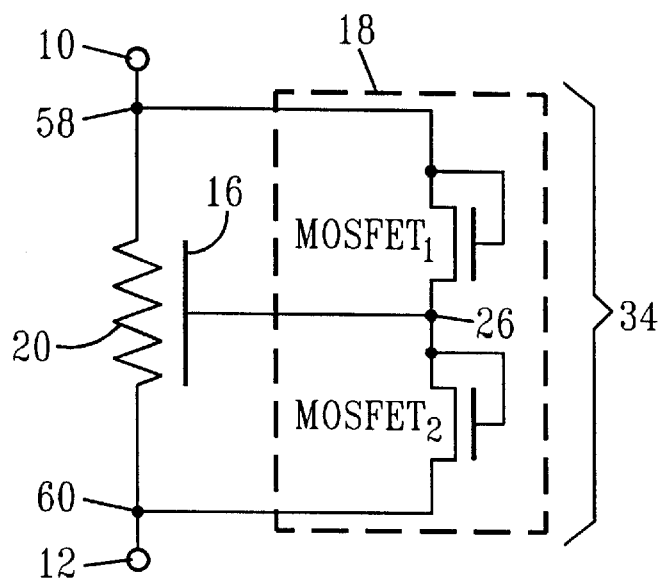

In FIG. 13, the overvoltage network is a divider 34 which comprises MOSFETs that are connected in series with each other through node 26 which is tied to gate 16 of buried resistor 20. In this figure, the MOSFETs are set between the input and output means.

Figure 14:
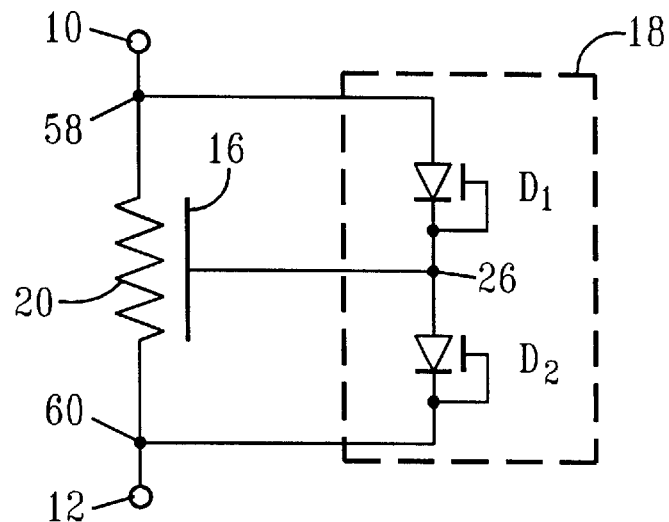

In FIG. 14, the overvoltage network is a pair of diodes, $D_1$ and $D_2$, that are connected in series with each other through node 26, which node, in turn, is tied up to gate 16 of buried resistor 20. In this figure, the diodes are set between the input and output means.

Figure 15:
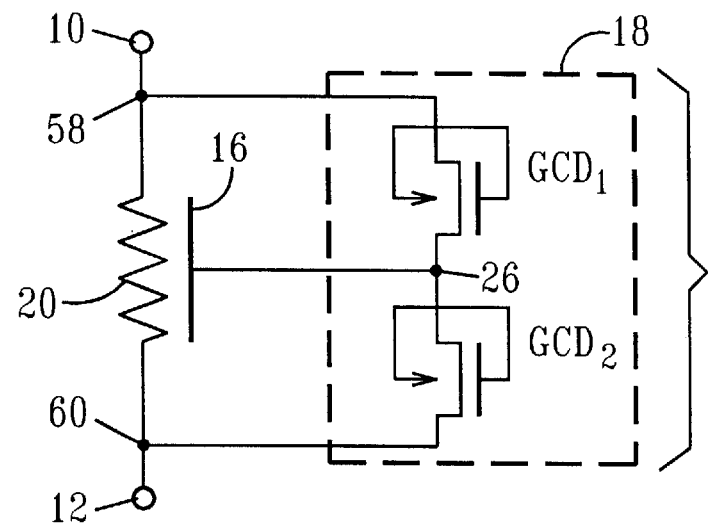

FIG. 15 illustrates a gated buried resistor device in which the overvoltage control network comprises two body and gate coupled diodes, $GCD_1$ and $GCD_2$, that are connected to each other through node 26. Node 26 is also the point of coupling with gate 16 of buried resistor 20. In this figure, the body and gate coupled diodes are set between the input and output means.

Figure 16:
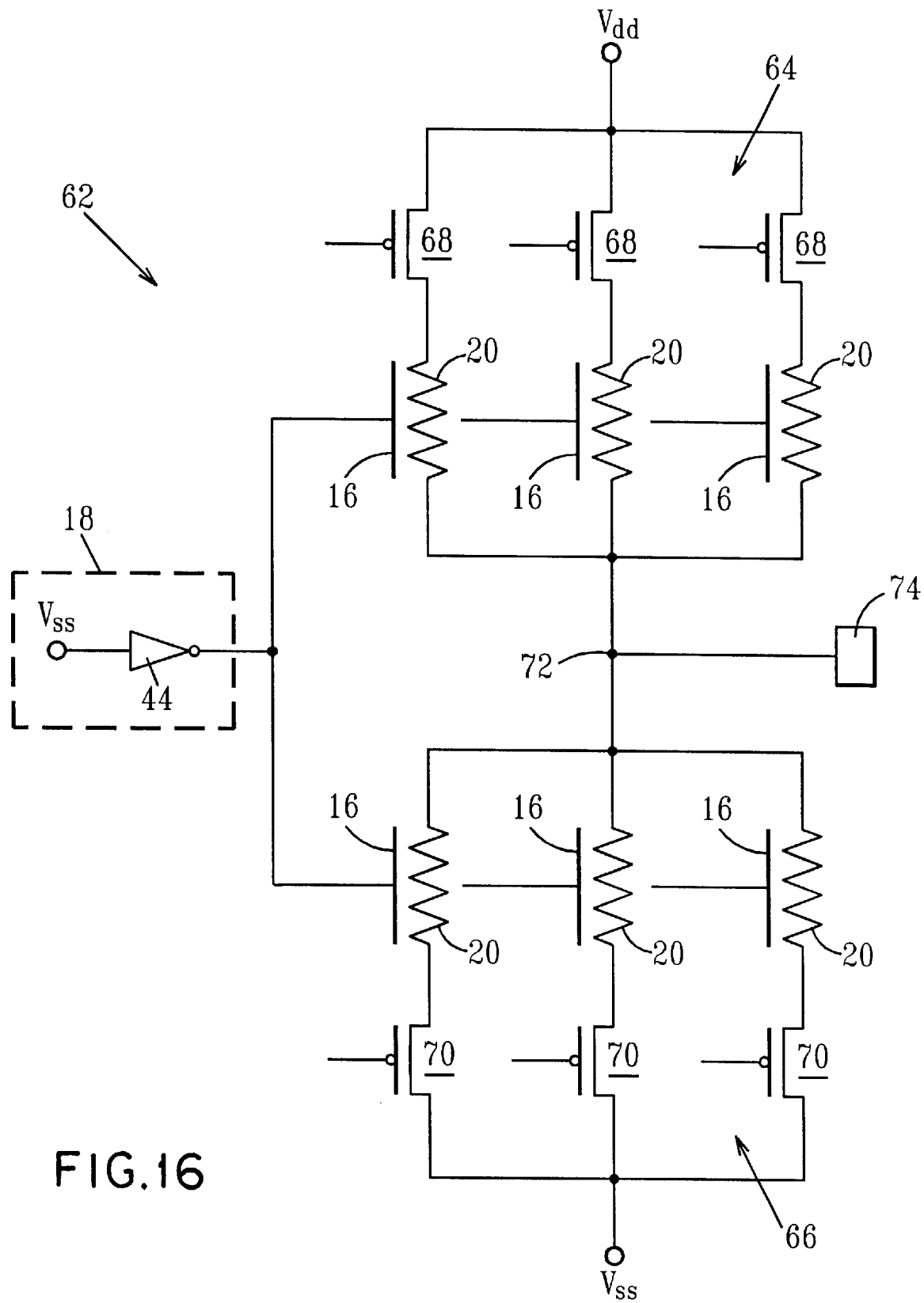
FIG. 16 is a circuit schematic of a buried resistor-ballasted off-chip with a buried resistor control network comprising an inverter.

FIG. 16 is a schematic showing the circuit of a buried resistor ballasted off-chip driver device 62 that contains an overvoltage network therein. Specifically, the off-chip driver comprises two regions, 64 and 66, containing buried ballasted resistors 20 (having gates 16) that are in parallel connection with each other. Each of the buried ballasted resistors in region 64 are coupled in series with pull-up PFETs 68, while the resistors in region 66 are in series connection with pull down NFETs 70. Node 72 between regions 64 and 66 is the point at which connection is made with a pad region 74. As shown, region 64 is tied up to a $V_{dd}$ power supply and region 66 is tied up to a $V_{ss}$ power supply. Moreover, each region shown is connected to node 26 through a gate of the buried resistor. The overvoltage network comprises an inverter 44 that is connected to a $V_{ss}$ power supply.

The above description and FIGS. 2–16 are directed to gated buried resistor devices which include at least one overvoltage network connected to the gate region of the buried resistor. The description that follows (and FIGS. 17–38) is directed to gated diode structures in which the gate of the diode is connected to an overvoltage control network.

Figure 17:
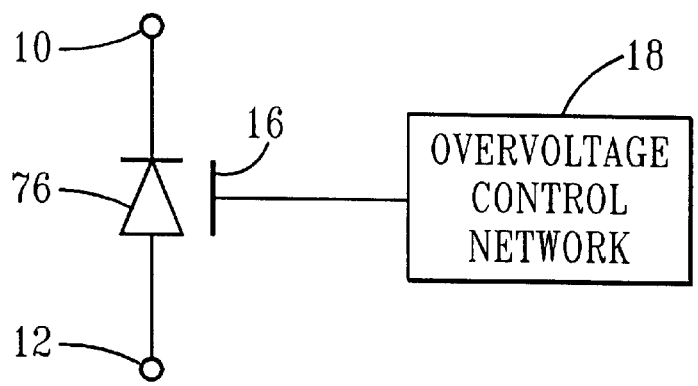
FIG. 17 is a block diagram of gated diode device of the present invention including a generic overvoltage control network coupled to the gate of the gated diode.
Figure 18:
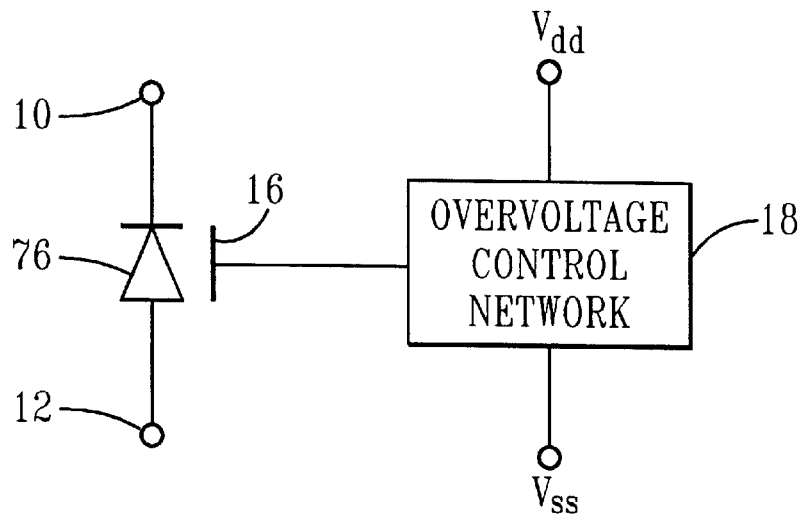
FIGS. 18–37 are block diagrams or circuit schematics of various lateral gated diodes devices of the present invention in which various overvoltage control networks are shown.
Figure 19:
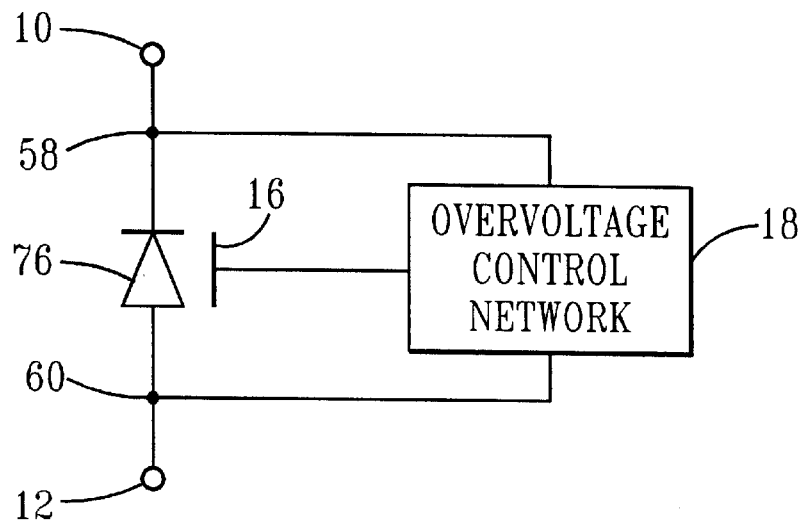

Specifically, FIG. 17 illustrates a generic circuit schematic of a gated diode structure of the present invention. Specifically, in FIG. 17, there is shown a diode 76 that contains a gate dielectric 16. The diode is connected to anode 10 and cathode 12 as shown. The gate of the diode is in turn connected to an overvoltage control network 18 that is capable of reducing electrical overstressing of the gated structure. As shown in FIG. 18, overvoltage control network 18 may be between two power rails, $V_{dd}$ and $V_{dd}$, or alternatively (See FIG. 19), overvoltage control network 18 may be coupled to the anode and cathode regions of the gated diode. In some embodiments, the control network is coupled to only one power source.

The various overvoltage control networks that can be used with gated diodes in which the control network is connected to one power source or between two power supplies will now be described in reference with FIGS. 20–28.

Figure 20:
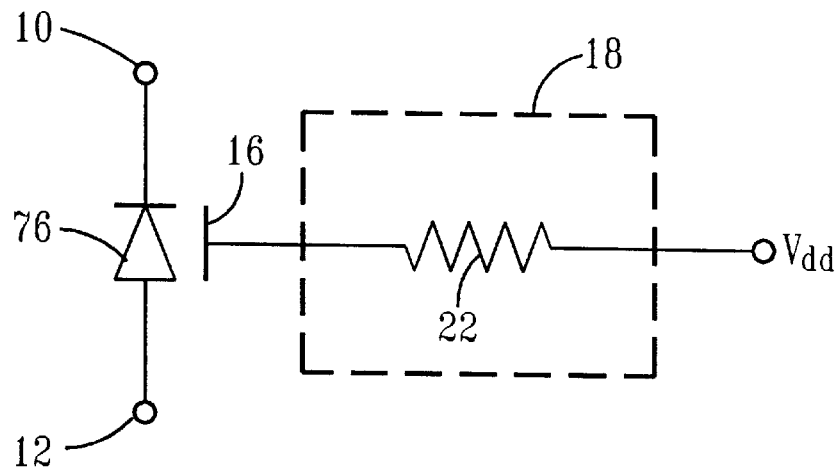
Figure 21:
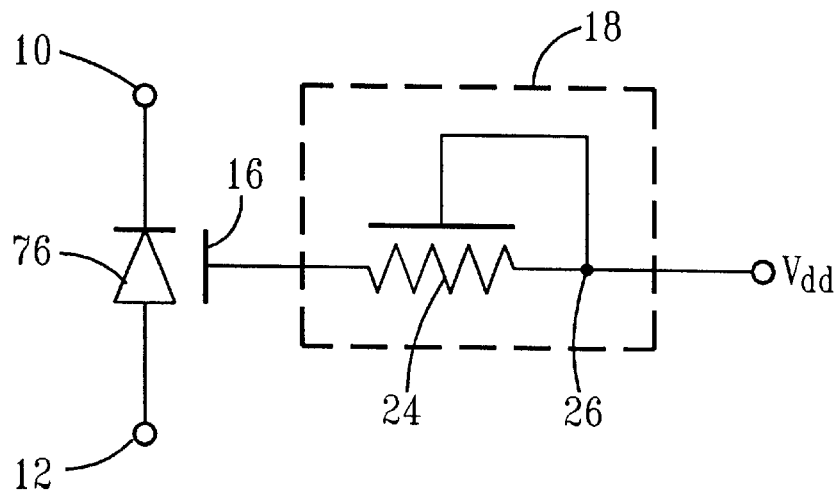

FIG. 20 shows a structure in which the overvoltage network is a resistor 22 in which one end thereof is connected to gate 16 of diode 76 and the other end of the control network is connected to $V_{dd}$. In FIG. 21, the overvoltage network is a buried resistor 24 that has a gate that is tied up to $V_{dd}$ through node 26.

Figure 22:
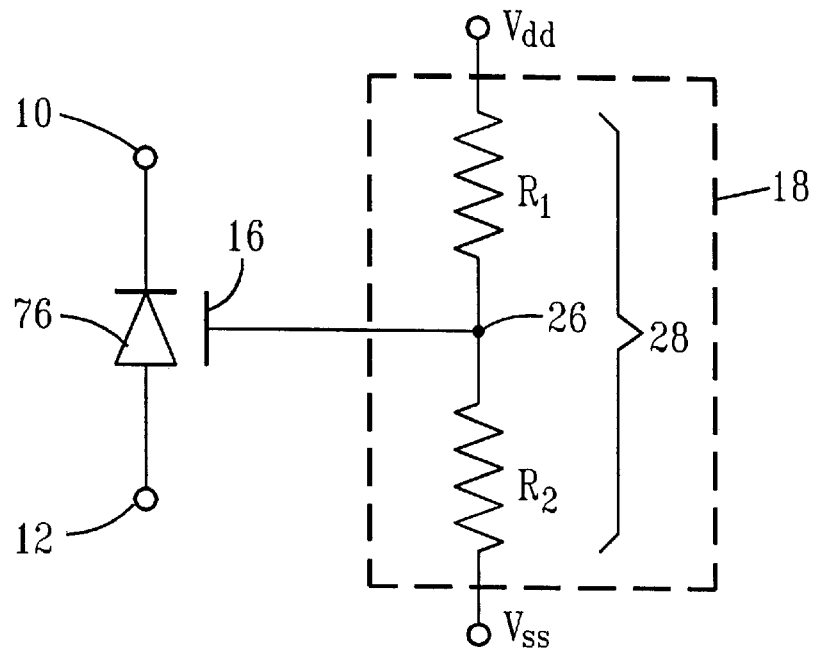

FIG. 22 shows a resistor divider 28 as the overvoltage control network. The resistor divider includes two resistors, $R_1$ and $R_2$, that are coupled in series through node 26. As shown, $R_1$ is also connected to $V_{dd}$ and $R_2$ is also connected to $V_{ss}$.

Figure 23:
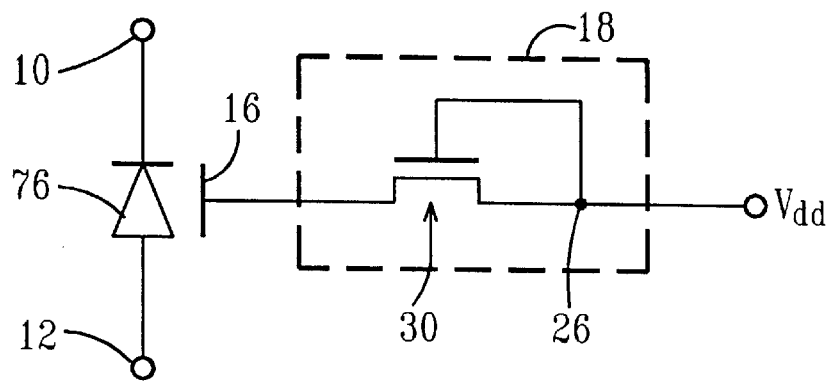
Figure 24:
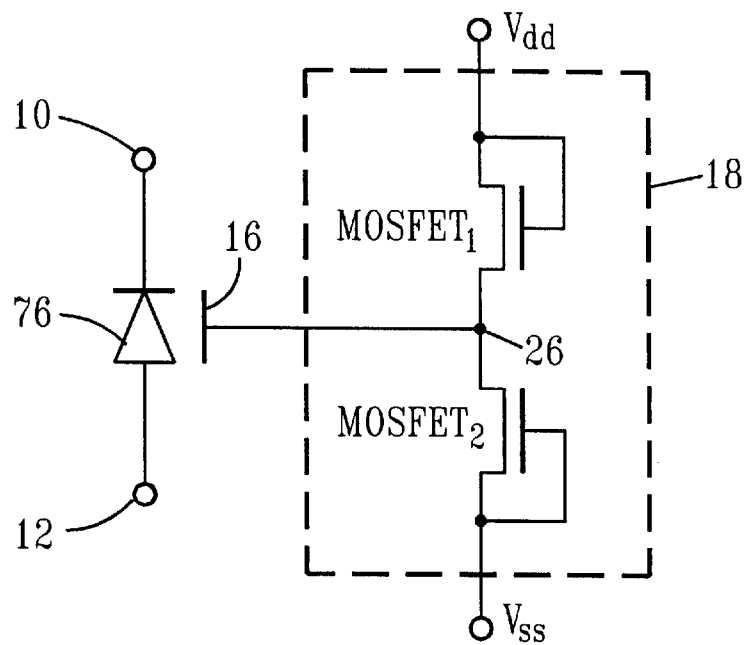

In FIG. 23, the overvoltage network is a "on" MOSFET 30 whose gate is tied to $V_{dd}$. In FIG. 24, the overvoltage network comprises two MOSFETs ($MOSFET_1$ and $MOSFET_2$) that are connected in series through node 26.

Figure 25:
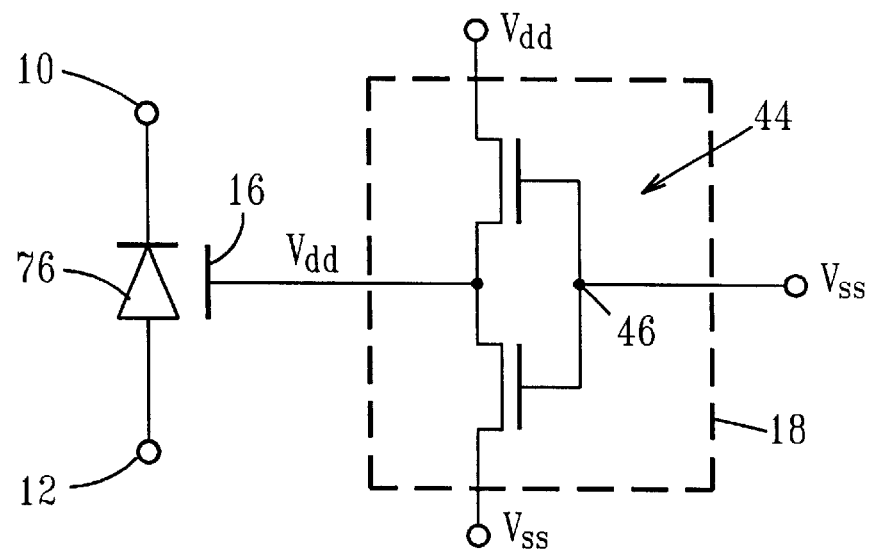

The gate of $MOSFET_1$ is tied to $V_{dd}$, while $MOSFET_2$ is connected to $V_s$. In FIG. 25, the overvoltage control network is a dummy bias inverter 44 in which the gate regions of the inverter are connected to each other through node 46 which node is also connected to $V_{ss}$.

Figure 26:
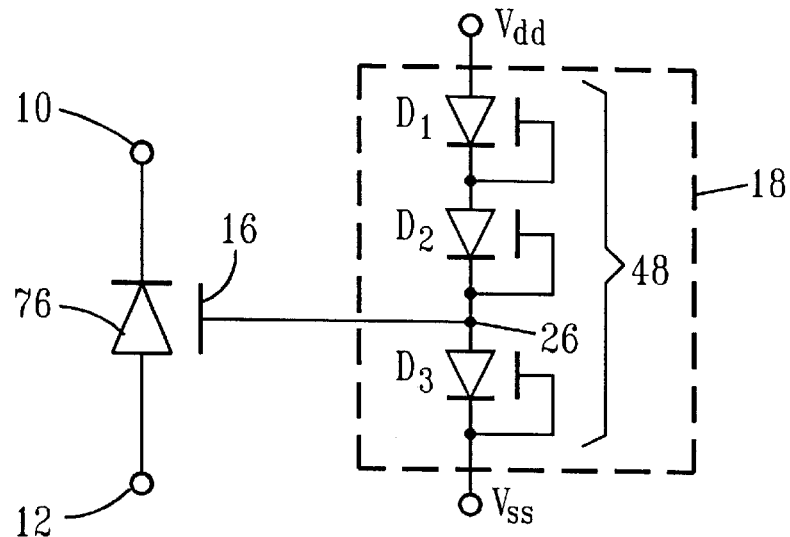
Figure 27:
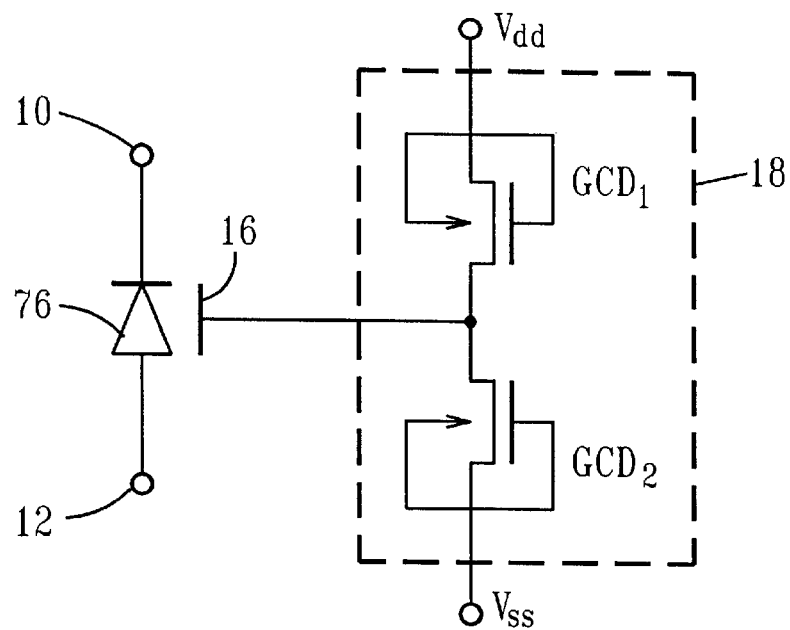
Figure 28:
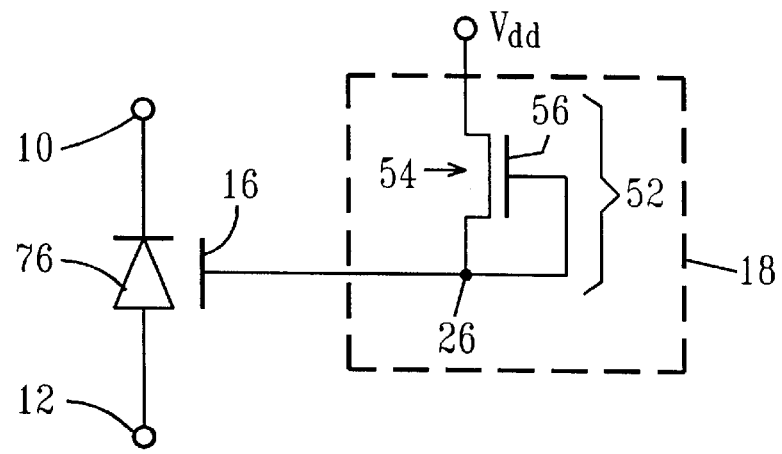
Figure 29:
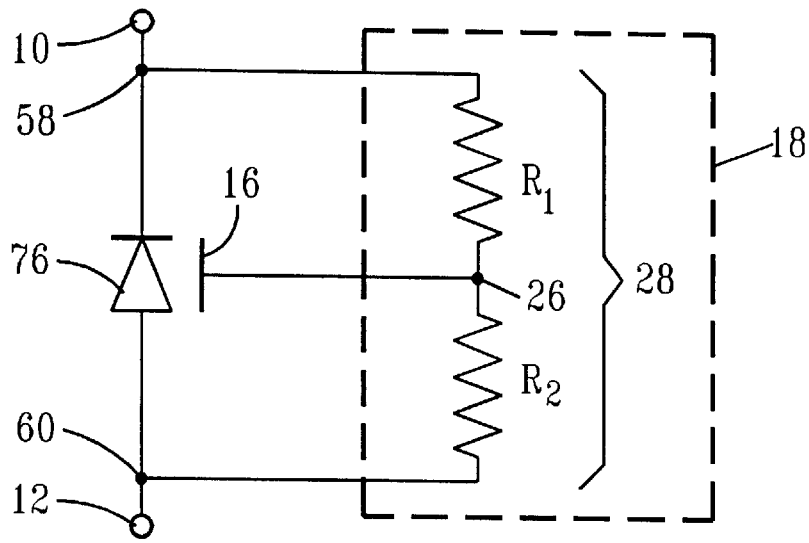

In FIG. 26, the overvoltage control network comprises three bulk or SOI gated diodes 48 that are connected in series with each other. The various ends of the gated diodes are connected to either $V_{dd}$ or $V_{ss}$. In FIG. 27, the overvoltage control network comprises two body and gate coupled diodes, $GCD_1$ and $GCD_2$. The control network shown in FIG. 28 is a PFET configured diode 52 in which the gate of the diode is tied to node 26.

Figure 30:
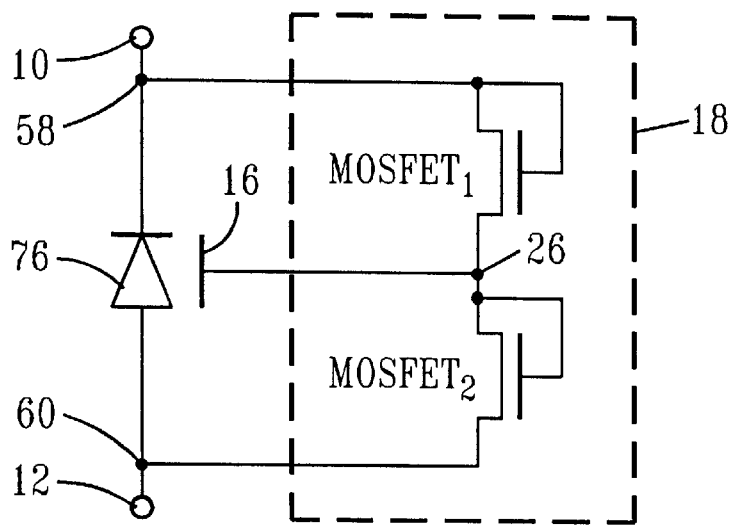
Figure 31:
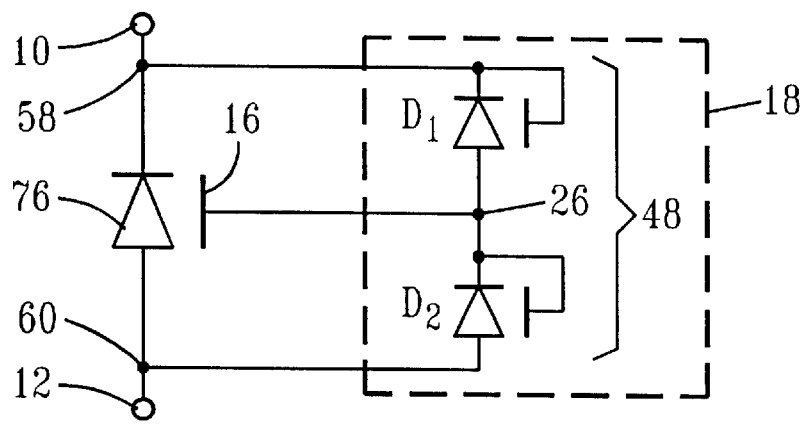
Figure 32:
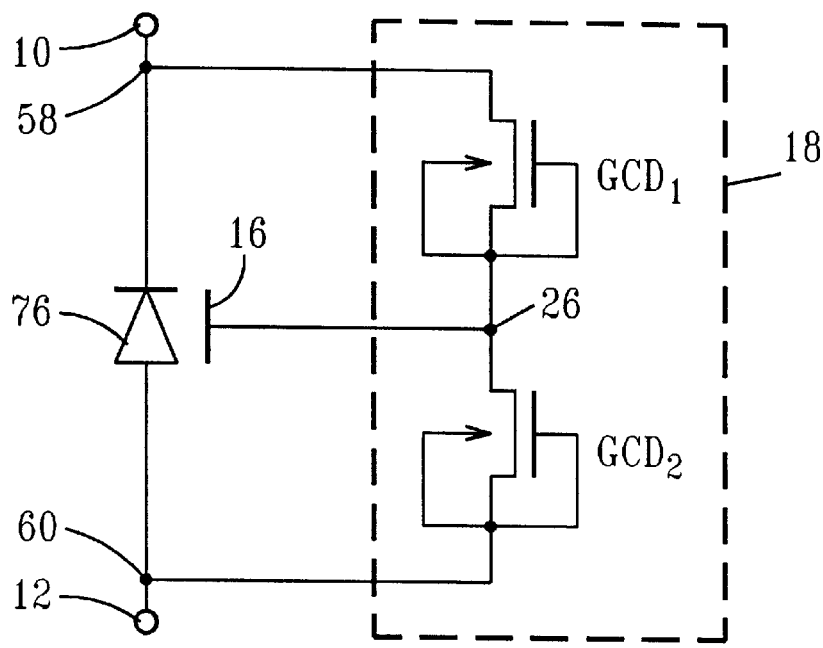

FIGS. 29–32 show gated diode devices in which the overvoltage network is tied to the anode and cathode of the device. Specifically, in FIG. 29, the control network comprises two resistors, $R_1$ and $R_2$, that are coupled in series through node 26. In FIG. 30, the control network comprises two MOSFETS, $MOSFET_1$ and $MOSFET_2$, connected in series through node 26. In FIG. 31, the control network comprises gated diodes 48 that are in series relationship with each. The control network in FIG. 32 comprises body and gate coupled diodes ($GCD_1$ and $GCD_2$) that are coupled in series through node 26.

Figure 33:
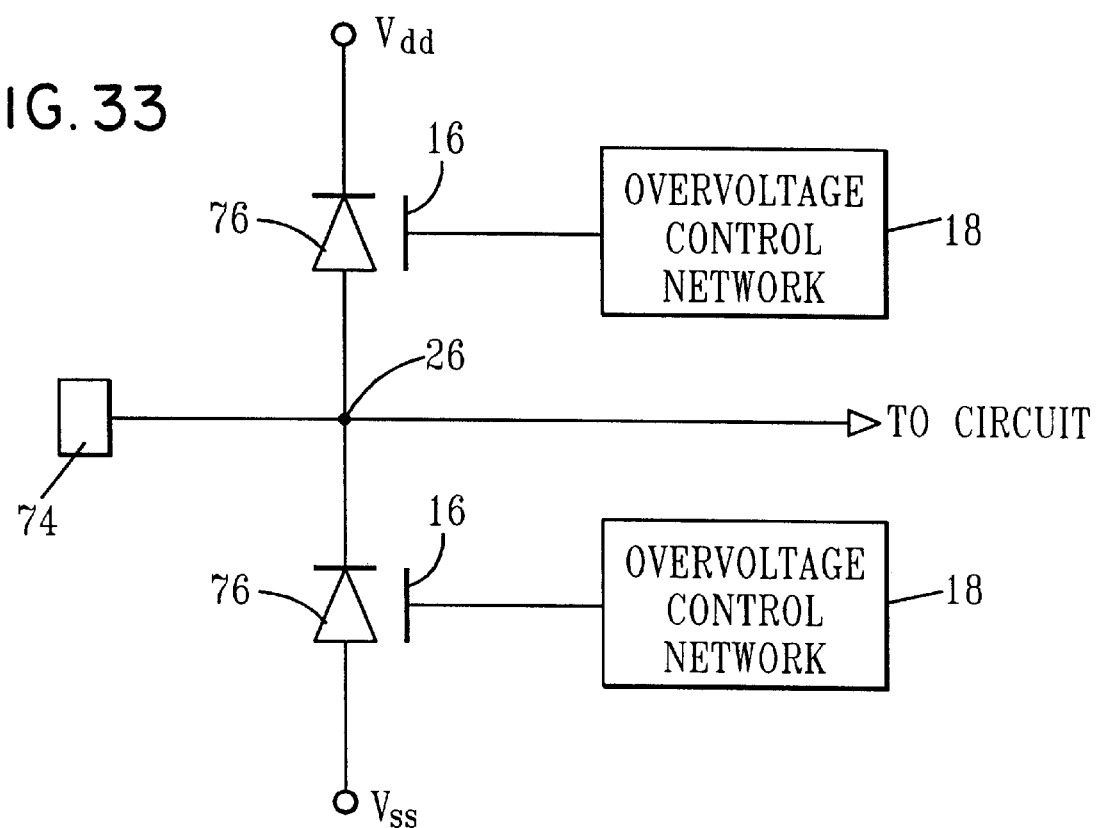
Figure 34:
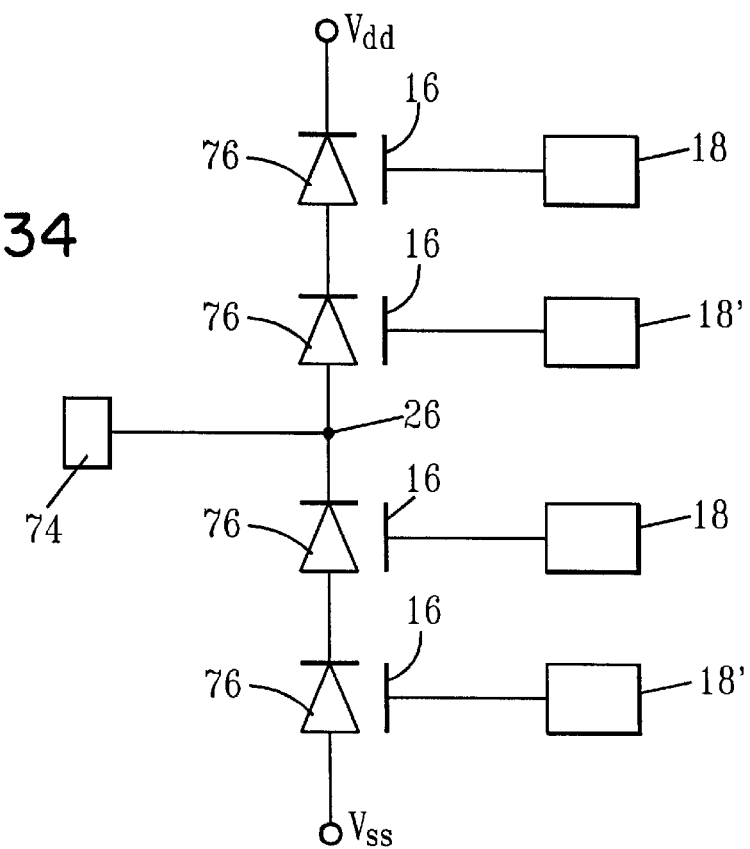

FIG. 33 shows a gated diode structure in which gated diodes 76 are connected to $V_{dd}$ and $V_{ss}$. Each gated diode is connected to an overvoltage control network 18 of the present invention. The gated diodes are connected in series through node 26. The node also serves as the point of connection with pad region 74. FIG. 34 shows an alternative structure to the one shown in FIG. 34 wherein four gated diodes 76 and two different control networks 18 and 18' are present.

Figure 35:
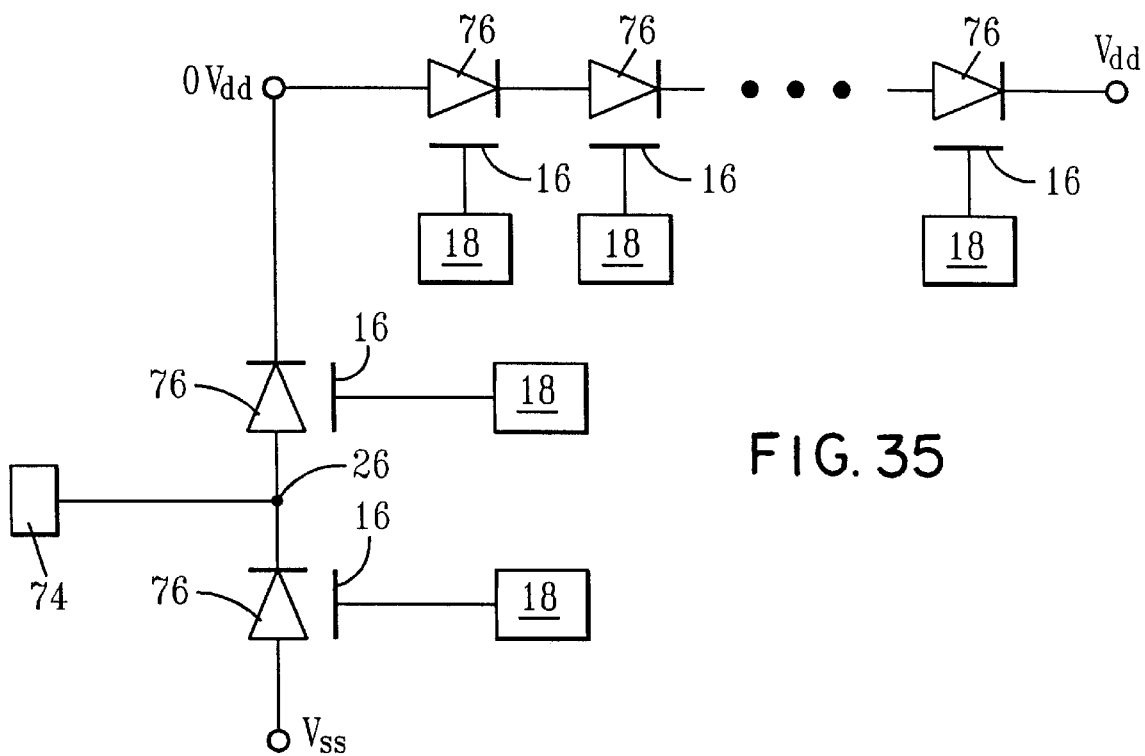
Figure 36:
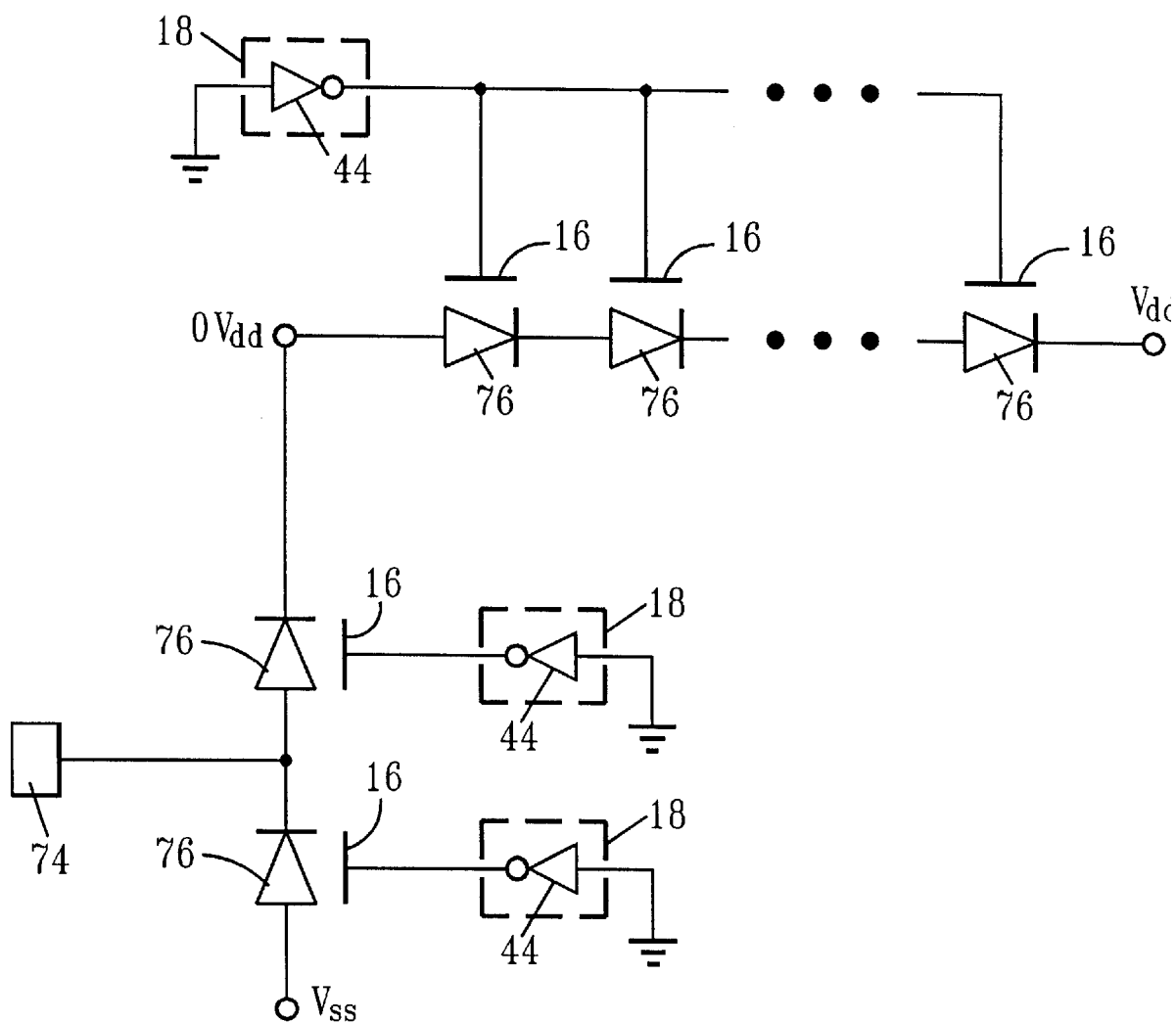
Figure 37:
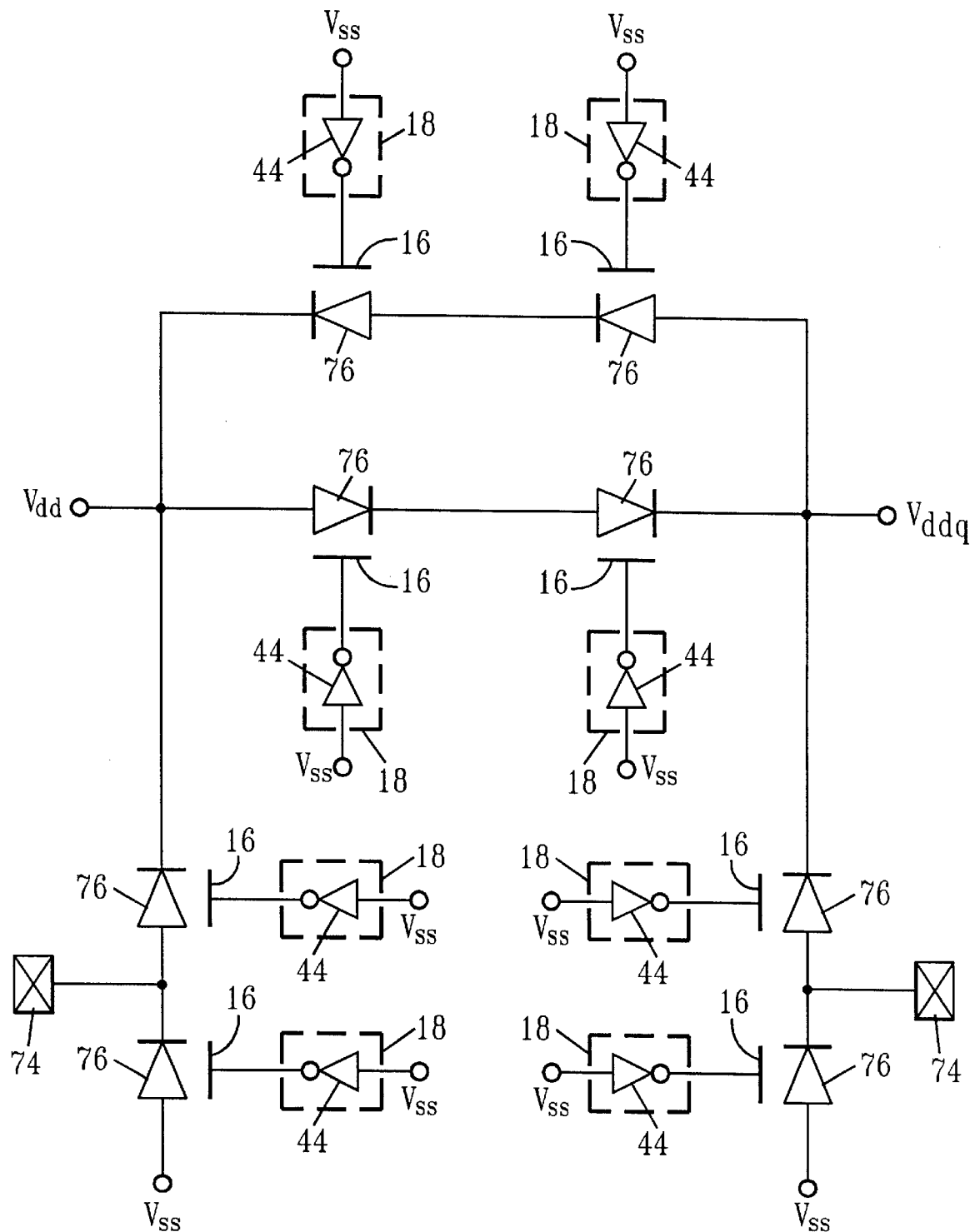
Figure 38:
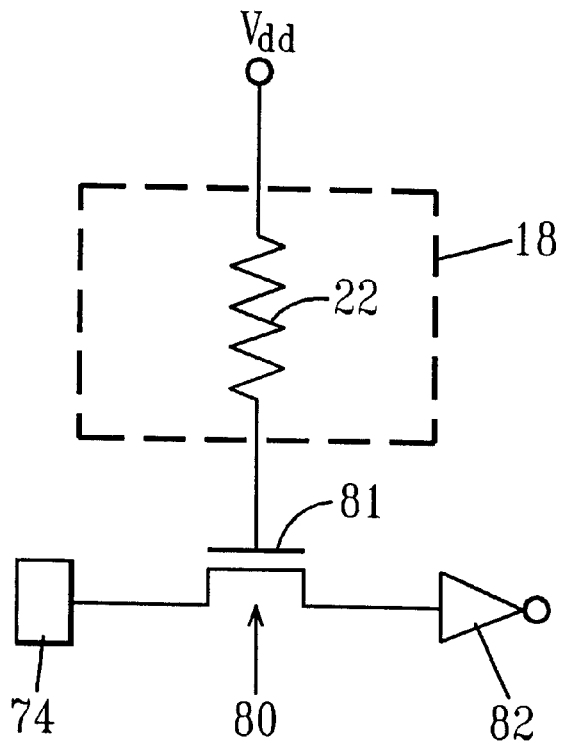
FIGS. 38–41 are circuit schematics of various N-channel MOSFET pass transistor devices of the present invention in which various overvoltage control networks are shown.

FIG. 35 is a mixed voltage application with multiple overvoltage control networks 18 are present; FIG. 36 is a mixed ESD network with SOI lubistors and dummy inverters 44 as the control network. FIG. 37 is an example of ESD protection on two independent pad regions 74 which are connected in a back to back manner to power supplies $V_{dd}$ and $V_{ddq}$ through a series of gated diodes 76. As shown, each gated diode includes a SOI lubistors and dummy inverters 44 as the overvoltage control network.

Figure 39:
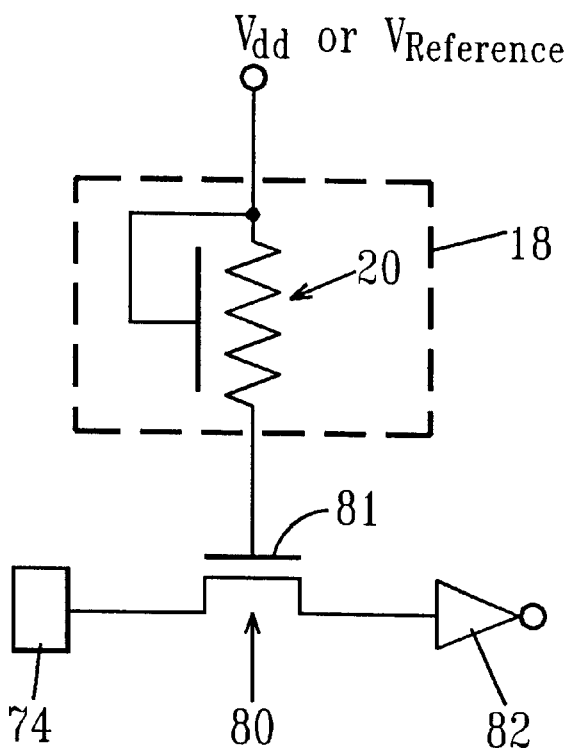
Figure 40:
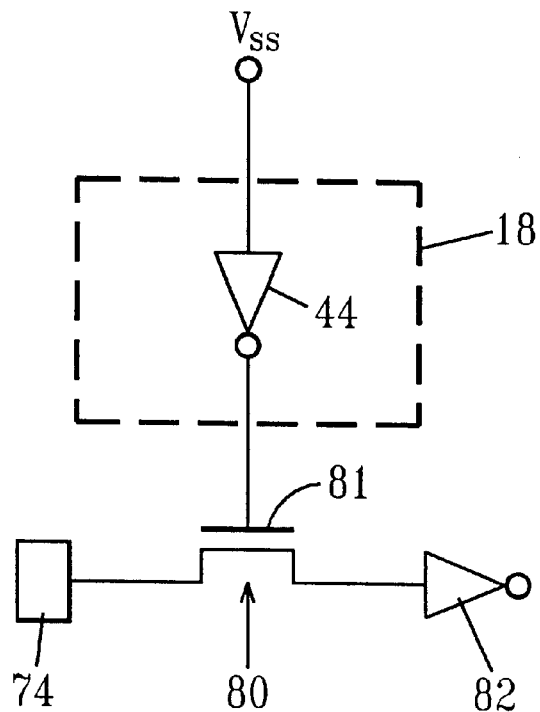
Figure 41:
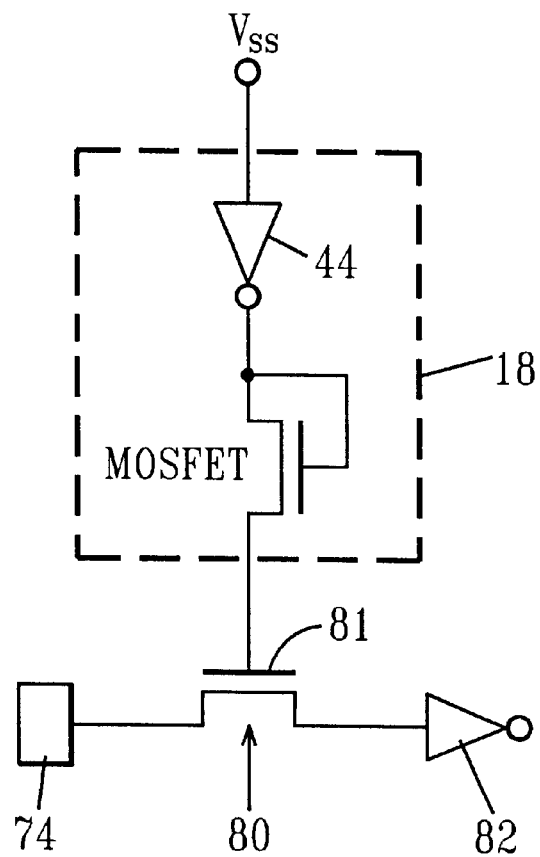

The following description and FIGS. 38–41 are directed to another embodiment of the present invention wherein n-channel MOSFETs are used as the gated structure. Specifically, FIG. 38 includes a n-channel MOSFET 80 in which one end thereof is connected to a receiver 82 and the other end of the MOSFET is connected to pad region 74 The gate of the MOSFET, gate 81, is coupled to resistor 22. Resistor 22 which serves as the overvoltage control network is formed between the MOSFET and $V_{dd}$. In FIG. 39, the overvoltage control network comprises a gated buried resistor 20; in FIG. 40, the overvoltage control network is a dummy inverter 44; in FIG. 41, overvoltage control network comprises a MOSFET and inverter 44 that is formed between the pass transistor and $V_{ss}$. In the figure, the gate of MOSFET is tied to a node which is also the point of connection with the inverter.

While this invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms described and illustrated, but fall within the scope of the appended claims.

What is claimed is:

1. A semiconductor structure comprising an anode of a first conductivity type; a cathode of a second conductivity type; a device region separating said anode and said cathode, said device region comprising a gate dielectric which separates a gate conductor from active areas present in a semiconductor substrate, said gate dielectric is not connected directly to a pad region; and an external overvoltage control network coupled to the gate dielectric of said device region, wherein said overvoltage control network substantially reduces electrical overstress of said gated device region.

2. The semiconductor device of claim 1 wherein said anode is an electron deficient region selected from the group consisting of drain regions, positive terminals of a power supply and output terminals.

3. The semiconductor device of claim 1 wherein said cathode is an electron rich region selected from the group consisting of source regions, pad regions, negative terminals of a power supply and input terminals.

4. The semiconductor device of claim 1 wherein said device region is formed in or on a semiconductor substrate.

5. The semiconductor device of claim 1 wherein said semiconductor substrate is bulk Si or silicon-on-insulator.

6. The semiconductor device of claim 1 wherein said device region is a buried resistor, a diode or a N-channel MOSFET pass transistor.

7. The semiconductor device of claim 1 wherein said overvoltage control network is a diode, resistor, buried resistor, voltage divider, on-MOSFET, dummy inverter, lubistor or any combination thereof.

8. The semiconductor device of claim 1 wherein said overvoltage control network is tied up to at least one power supply or to said anode and cathode.

9. The semiconductor device of claim 1 wherein said overvoltage control network is tied up to two power supplies.

10. The semiconductor device of claim 1 wherein said device region is a buried resistor and said overvoltage control network is a resistor or a series of resistors.

11. The semiconductor device of claim 1 wherein said device region is a buried resistor and said overvoltage control network is a gated buried resistor.

12. The semiconductor device of claim 1 wherein said device region is a buried resistor and said overvoltage control network is a series of MOSFETs.

13. The semiconductor device of claim 1 wherein said device region is a buried resistor and said overvoltage network is an on-MOSFET.

14. The semiconductor device of claim 1 wherein said device region is a buried resistor and said overvoltage network is an inverter.

15. The semiconductor device of claim 1 wherein said device region is a buried resistor and said overvoltage control network is a gated diode or a series of gated diodes.

16. The semiconductor device of claim 1 wherein said device region is a buried resistor and said overvoltage control network is a SOI diode.

17. The semiconductor device of claim 1 wherein said device region is a buried resistor and said overvoltage control network is a diode configured MOSFET containing a PFET.

18. The semiconductor device of claim 1 wherein said device region comprises a first region of buried ballasted resistors and PFETs, wherein said ballasted resistors and said PFETs are in series with each other, a second region of ballasted resistors and NFETs, wherein said ballasted resistors and said NFETs are in series with each other, and said overvoltage control network is an inverter that is connected to a power supply.

19. The semiconductor device of claim 1 wherein said device region is a diode and said overvoltage control network is a resistor or a series of resistors.

20. The semiconductor device of claim 1 wherein said device region is a diode and said overvoltage control network is a gated buried resistor.

21. The semiconductor device of claim 1 wherein said device region is a diode and said overvoltage control network is an on MOSFET.

22. The semiconductor device of claim 1 wherein said device region is a diode and said overvoltage control network is a series of MOSFETs.

23. The semiconductor device of claim 1 wherein said device region is a diode and said overvoltage control network is a dummy bias inverter.

24. The semiconductor device of claim 1 wherein said device region is a diode and said overvoltage control network is a series of gated diodes.

25. The semiconductor device of claim 1 wherein said device region is a diode and said overvoltage control network is a series of body and gate coupled diodes.

26. The semiconductor device of claim 1 wherein said device region is a diode and said overvoltage control network is a PFET configured diode.

27. The semiconductor device of claim 1 wherein said device region is a n-channel MOSFET pass transistor and said overvoltage control network is a resistor or a series of resistors.

28. The semiconductor device of claim 1 wherein said device region is a n-channel MOSFET pass transistor and said overvoltage control network is a buried resistor.

29. The semiconductor device of claim 1 wherein said device region is a n-channel MOSFET pass transistor and said overvoltage control network is a dummy inverter.

30. The semiconductor device of claim 1 wherein said device region is a n-channel MOSFET pass transistor and said overvoltage control network is a MOSFET.

* * * * *